(12) United States Patent
Gauthier et al.

(10) Patent No.: US 11,776,995 B2
(45) Date of Patent: Oct. 3, 2023

(54) DEVICE COMPRISING A TRANSISTOR

(71) Applicant: STMicroelectronics (Crolles 2) SAS, Crolles (FR)

(72) Inventors: Alexis Gauthier, Meylan (FR); Pascal Chevalier, Chapareillan (FR); Gregory Avenier, Saint Nazaire les Eymes (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/734,486

(22) Filed: May 2, 2022

(65) Prior Publication Data

US 2022/0254879 A1     Aug. 11, 2022

Related U.S. Application Data

(62) Division of application No. 16/995,079, filed on Aug. 17, 2020, now Pat. No. 11,355,581.

(30) Foreign Application Priority Data

Aug. 19, 2019   (FR) ...................................... 1909283

(51) Int. Cl.
| | | |
|---|---|---|
| *H01L 29/06* | (2006.01) | |
| *H01L 21/8222* | (2006.01) | |
| *H01L 29/66* | (2006.01) | |
| *H01L 29/732* | (2006.01) | |

(52) U.S. Cl.
CPC ...... *H01L 29/0642* (2013.01); *H01L 21/8222* (2013.01); *H01L 29/6634* (2013.01); *H01L 29/7322* (2013.01)

(58) Field of Classification Search
CPC ............. H01L 29/0642; H01L 21/8222; H01L 29/6634; H01L 29/7322; H01L 21/76224; H01L 29/0649; H01L 29/1004; H01L 29/66287; H01L 29/732; H01L 29/0821
See application file for complete search history.

(56) References Cited

U.S. PATENT DOCUMENTS

| | | |
|---|---|---|
| 10,629,584 B1 | 4/2020 | Zeng |
| 2004/0058503 A1 | 3/2004 | Cha |
| 2010/0022056 A1 | 1/2010 | Donkers et al. |
| 2010/0327280 A1 | 12/2010 | Joseph et al. |
| 2011/0156143 A1 | 6/2011 | Chiu et al. |
| 2013/0270649 A1 | 10/2013 | Chantre et al. |
| 2014/0167116 A1 | 6/2014 | Chevalier et al. |
| 2017/0288042 A1 | 10/2017 | Dahl et al. |
| 2018/0197781 A1 | 7/2018 | Chevalier et al. |

FOREIGN PATENT DOCUMENTS

| | | |
|---|---|---|
| DE | 102014113989 A1 | 3/2016 |
| DE | 102015204411 A1 | 9/2016 |
| GB | 2425400 A | 10/2006 |
| JP | S60117664 A | 6/1985 |

OTHER PUBLICATIONS

INPI Search Report and Written Opinion for FR 1909283 dated Apr. 22, 2020 (11 pages).

*Primary Examiner* — Syed I Gheyas
(74) *Attorney, Agent, or Firm* — CROWE & DUNLEVY (57) ABSTRACT

A transistor is produced by forming a first part of a first region of the transistor in a semiconductor substrate by implanting dopants through an opening in an isolating trench formed at an upper surface of the semiconductor substrate. A second region of the transistor in the opening by epitaxy.

24 Claims, 5 Drawing Sheets

DEVICE COMPRISING A TRANSISTOR

CROSS-REFERENCE TO RELATED APPLICATIONS

This application is a divisional of U.S. patent application Ser. No. 16/995,079, filed Aug. 17, 2020, which claims the priority benefit of French Application for Patent No. 1909283, filed on Aug. 19, 2019, the content of which is hereby incorporated by reference in its entirety to the maximum extent allowable by law.

TECHNICAL FIELD

The present disclosure relates generally to electronic devices and, more specifically, to electronic devices comprising transistors.

BACKGROUND

The transistor is an electronic component used in most circuits or electronic devices. Several types of transistors exist.

A bipolar transistor is a semiconductor-based electronic device from the family of transistors. Its operating principle is based on two PN junctions, one that is direct-biased and the other that is reverse-biased.

There is a need in the art to address all or some of the drawbacks of known devices comprising a transistor. There is also a need in the art to address all or some of the drawbacks of known methods for manufacturing devices comprising a transistor.

SUMMARY

One embodiment provides a method for forming a device comprising a transistor, the method comprising: a) forming a first part of a first region of the transistor by implanting dopants through an opening in an isolating trench; and b) forming a second region of the transistor in the opening by epitaxy.

According to one embodiment, the method comprises, before steps a) and b): c) forming the isolating trench in a substrate; and d) forming isolating walls on either side of the isolating trench, separated from the isolating trench by substrate portions.

According to one embodiment, the method comprises, after steps c) and d), and before steps a) and b): e) forming a second part of the first region, extending below the isolating trench and below the isolating walls.

According to one embodiment, the method comprises, after step e), and before steps a) and b), forming a third region extending between the isolating trench and the second part of the first region.

According to one embodiment, the transistor is a bipolar transistor, the first region being a collector region, the second region being an emitter region and the third region being a base region.

According to one embodiment, the height of the first part of the first region is greater than 50 nm, the height of the second region is between about 50 and about 100 nm, and the height of the third region is between about 100 and about 250 nm.

According to another embodiment, the transistor comprises a first part of a first region and a second region located facing one another and having substantially equal horizontal dimensions.

According to one embodiment, the lateral surfaces of the first region are in contact with an isolating trench.

According to one embodiment, the transistor comprises a third region extending between the first part of the first region and the second region and extending below the isolating trench.

According to one embodiment, the first region comprises a second part extending across from the third region, the first part of the first region being located between the second part of the first region and the third region.

According to one embodiment, the second part of the first region is partially separated from the third region by non-doped portions of a semiconductor substrate.

According to one embodiment, the first, second and third regions are buried regions.

According to one embodiment, the transistor is a PNP transistor.

According to one embodiment, the transistor is a bipolar transistor.

According to one embodiment, the first region is a collector region, the second region is an emitter region and the third region is a base region.

According to one embodiment, the height of the first part of the first region is greater than 50 nm, the height of the second region is between about 50 and about 100 nm, and the height of the third region is between about 100 and about 250 nm.

According to one embodiment, the second region is doped with boron.

According to one embodiment, the upper face of the transistor is substantially planar.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

The isolating elements (layers, walls, trenches, etc.) are, for example, made from silicon oxide or silicon nitride.

Figure 1:
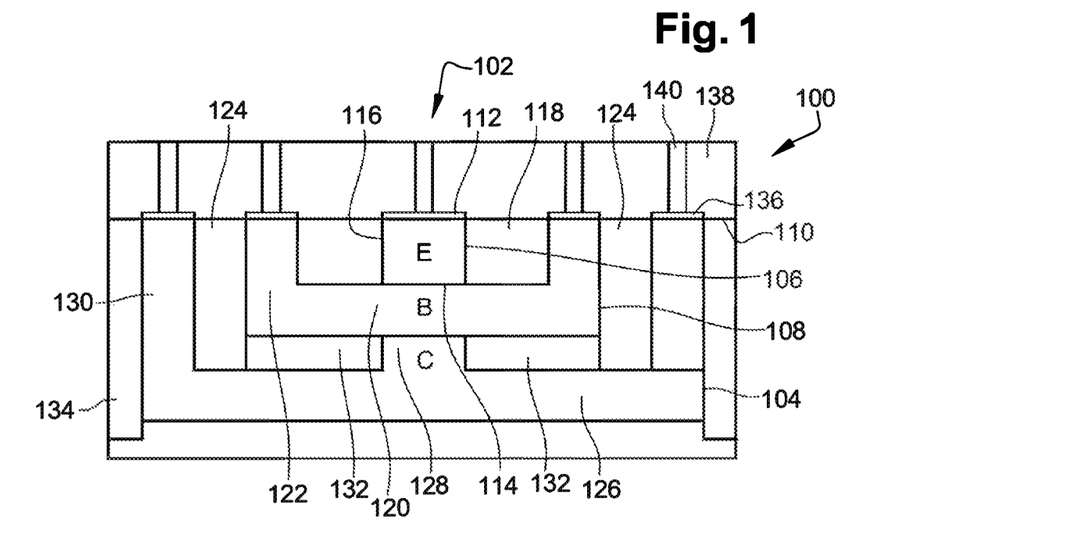
FIG. 1 is a sectional view of one embodiment of a device comprising a transistor.

FIG. 1 is a sectional view of one embodiment of a device 100 comprising a transistor 102.

The device 100 comprises a semiconductor substrate. The semiconductor substrate is, for example, made from silicon. Preferably, the substrate is not doped.

A non-doped semiconductor material refers to a material having a doping concentration less than about $10^{17}$ dopants/cm$^3$.

The transistor 102 in this example is a bipolar transistor. In this example, the transistor 102 is of the PNP type. As a variant, the transistor could be a bipolar transistor of the NPN type, the doping types of the different semiconductor regions then being reversed.

The transistor 102 comprises three regions. The transistor 102 comprises first, second and third regions, respectively a collector region 104, or collector 104, an emitter region 106, or emitter 106, and a base region 108, or base 108.

The transistor 102 is a buried transistor, that is to say, all of the regions of the transistor are located in the substrate. The three regions of the transistor 104, 106 and 108 are therefore located below an upper face 110 of the substrate. The upper face 110 is preferably planar, at least at the transistor 102. For example, the upper face of the substrate is substantially parallel to a lower face of the substrate.

In the example of FIG. 1, the collector region 104 is located below the base region 108 and the base region 108 is located below the emitter region 106. The collector region 104 is therefore the deepest region. The emitter region 106 is therefore the shallowest region.

The emitter region 106 is, for example, substantially flush with the upper face 110 of the substrate. The upper face of the emitter region 106 is, for example, substantially coplanar with the upper face 110 of the substrate.

The emitter region 106, for example, has is substantially in the shape of a parallelogram, or has a substantially cylindrical shape. In the section plane of FIG. 1, the emitter region has an upper face 112, a lower face 114, and two lateral surfaces 116. The upper face 112 is a face substantially coplanar with the upper face 110 of the substrate. The lower face 114 is parallel to the upper face 112. The lateral surfaces 116 are, for example, substantially perpendicular to the upper and lower faces. The lateral surfaces 116 link the upper and lower faces.

The emitter region 106, for example, has a height (thickness) of between about 50 and about 100 nm. The width of the emitter region 106 is, for example, between about 150 nm and about 250 nm, preferably substantially equal to 200 nm.

"Height" refers to the dimension in the direction orthogonal to the plane of the upper face of the substrate. The height is therefore the distance between the upper face 112 of the emitter and the lower face 114 of the emitter. Preferably, the height is the dimension in the direction orthogonal to the plane of the upper face of the substrate in the location where the dimension is maximal.

"Width" refers to the dimension, in the plane of FIG. 1, in a direction parallel to that of the upper face of the substrate. The width is therefore the distance between the lateral surfaces 116 of the emitter 106. Preferably, the width is the distance between the lateral surfaces in the location where the distance is maximal.

The emitter region 106 is made from a P-doped semiconductor material. The region 106 is, for example, made from silicon. The region 106 is, for example, doped with boron. The region 106 is, for example, preferably doped with boron and carbon. The doping of the emitter region is, for example, between about $5*10^{19}$ and about $10^{20}$ dopants/cm$^3$.

The emitter region is surrounded by an isolating trench 118. The isolating trench is, for example, a trench of the SSTI (Super Shallow Trench Isolation) type. The isolating trench 118 is preferably made from a ring around the emitter region 106.

The trench 118 extends over the entire height (thickness) of the emitter region 106. Preferably, the isolating trench 118 does not cover the upper face of the emitter region 106. Preferably, the isolating trench 118 does not cover the lower face of the emitter region 106.

The height of the isolating trench 118 is preferably substantially equal to the height of the emitter region 106. The upper face of the isolating trench is preferably substantially coplanar to the upper face 112 of the emitter region 106. The lower face of the isolating trench 118 is preferably substantially coplanar to the lower face 114 of the emitter region 106.

The base region 108 comprises two parts: a primary part 120 and connecting branches 122.

The primary part 120 is preferably a substantially horizontal layer, that is to say, a layer extending in a plane substantially parallel to the upper face 110 of the substrate. The primary part 120 is preferably a continuous layer. The primary part 120 therefore preferably does not comprise an opening. The upper and lower faces of the primary part 120 are, for example, substantially parallel and preferably substantially planar.

The primary part 120 extends below the isolating trench 118. The primary part 120 further extends below the emitter region. Preferably, the entire isolating trench 118 is located across from the primary part 120. The primary part 120 is in contact with the lower face 114 of the emitter region. The primary part 120 is in contact with the lower face of the isolating trench 118.

The height (thickness) of the primary part 120 is, for example, between about 100 nm and about 250 nm.

The connecting branches 122, for example, form a ring around the isolating trench 118. The connecting branches 122 preferably correspond to a continuous wall surrounding the isolating trench 118. As a variant, the ring may comprise several branches that are separate from one another and separated from one another by isolating walls that are not shown.

The connecting branches 122, separate or in the form of one continuous wall, extend in a direction orthogonal to the plane in which the primary part extends. The connecting branches 122 preferably extend from the level of the upper face 112 of the emitting region 106 to the level of the lower face of the primary part 120 of the base region 108. The connecting branches 122 extend along lateral surfaces of the isolating trench 118. The connecting branches are in contact with the isolating trench, preferably over the entire height of the isolating trench. The connecting branches are in contact with the primary part 120. More specifically, the connecting branches are electrically and mechanically connected with the primary part 120.

The base region 108 is made from a semiconductor material. In the example of FIG. 1, the base region is made from an N-doped semiconductor material, for example doped silicon. The base region is, for example, doped with arsenic or phosphorus. The doping of the base region is, for example, between about $5*10^{18}$ and about $10^{19}$ dopants/cm$^3$.

The device 100 comprises an isolating wall 124. The isolating wall 124 is of the STI (Shallow Trench Isolation) type. The isolating wall 124 extends more deeply than the isolating wall 118. The isolating wall 124 extends from the upper face 110 of the substrate. Preferably, the isolating wall 124 extends at least to the lower face of the primary part 120 of the base region 108. Preferably, the isolating wall 124 extends more deeply than the lower face of the primary part 120 of the base region 108.

The height (thickness) of the isolating wall 124 is, for example, between about 250 nm and about 350 nm, preferably equal to about 300 nm.

The isolating wall 124 extends along the connecting branches 122. The isolating wall is preferably in contact with the connecting branches 122, preferably over the entire height of the connecting branches 122.

The isolating wall 124 preferably surrounds the connecting branches 122. The isolating wall 124 preferably forms a ring around the connecting branches. The isolating wall 124 is located on the side of the connecting branches 122 of the base region opposite the side of the connecting branches 122 facing the emitter region.

The collector region 104 comprises several parts: a primary part 126, a secondary part 128 and connecting branches 130.

The secondary part 128 is located in contact with the primary part 120 of the base region 108. The secondary part 128 is separated from the emitter region by the primary part 120 of the base region.

The secondary part 128 is located facing the emitter region 106. The dimensions, in a plane parallel to the upper face 110 of the substrate, of the emitter region and the secondary part 128 are substantially equal. The emitter region 106 and the secondary part 128 of the collector region 104 are therefore substantially aligned. In other words, each lateral surface of the emitter region is substantially aligned with a lateral surface of the secondary part 128. Each lateral surface of the emitter region is therefore substantially in a same plane as a lateral surface of the secondary part 128.

The height (thickness) of the secondary part 128 is, for example, greater than 50 nm, for example between about 50 nm and about 70 nm, preferably equal to about 60 nm.

The secondary part 128 is, for example, surrounded by regions 132 of semiconductor material, for example regions of the semiconductor substrate. The regions 132 of semiconductor material are preferably not doped. The secondary part 128 is therefore in contact with the regions of semiconductor material 132 by at least two lateral surfaces, for example the lateral surfaces in the plane of FIG. 1, preferably by all of the lateral surfaces. The regions 132, for example, form a ring around the secondary part 128.

The primary part 126 is preferably a substantially horizontal layer, that is to say, a layer extending in a plane, for example, substantially parallel to the upper face 110 of the substrate or in a plane substantially parallel to the lower face of the primary part 120 of the base region 108. The primary part 126 is preferably a continuous layer. The primary part 126 therefore preferably does not comprise an opening. The lower and upper faces of the primary part 126 are, for example, substantially parallel and preferably substantially planar.

The primary part 126 extends below the primary part 120 of the base region 108, preferably below the entire base region 108. The primary part 126 therefore extends below the emitter region 106 and below the isolating trench 118. The primary part 126 extends below the secondary part 128, below the regions 132 of semiconductor material and below the isolating walls 124.

The primary part 126 is in contact with the secondary part 128. The primary part 126 is mechanically and electrically connected to the base region 108 by the secondary part 128. Around the secondary part 128, the primary part 126 is separated from the base region 108, in particular from the primary part 120 of the base region 108, by the semiconductor material regions 132.

The connecting branches 130, for example, form a ring around the isolating wall 124. The connecting branches 130 preferably correspond to a continuous wall surrounding the isolating wall 124. As a variant, the ring may comprise several branches that are separate from one another and separated from one another by isolating walls that are not shown.

The connecting branches 130, separate or in the form of one continuous wall, extend in a direction substantially orthogonal to the plane in which the primary part 126 extends. The branches 130 extend along lateral surfaces of the isolating walls 124. The branches 130, for example, extend substantially from the lower face of the primary part 126 of the collector region 104 to the upper face 110 of the substrate. The branches 130 therefore extend to the level of the upper face 112 of the emitter region 106. Preferably, the branches 130 are in contact with the isolating wall 124 over the entire height of the wall 124. The branches 130 are mechanically and electrically connected with the primary part 126 by the lower part of the branches 130.

The connecting branches 130 are preferably substantially parallel to the connecting branches 122. The lateral surfaces of the branches 130 and 122 are preferably substantially parallel to one another. The branches 130 and 122 are separated from one another by the isolating wall 124.

The collector region 104 is made from a semiconductor material, in this example P-doped, for example made from P-doped silicon. The collector region is, for example, doped with boron or indium. The doping of the collector region is for example between about $5*10^{17}$ and about $10^{18}$ dopants/cm$^3$.

The dimensions, in a plane parallel to the upper face of the substrate, of the primary part 126 are greater than the dimensions, in a parallel plane, of the secondary part 128, for example at least four times greater.

The device 100 further comprises an isolating wall 134. The isolating wall is, for example, a wall of the DTI (Deep Trench Isolation) type. The isolating wall 134 extends more deeply than the isolating wall 124. The isolating wall 134 extends from the upper face 110 of the substrate. Preferably, the isolating wall 134 extends at least to the lower face of the primary part 126 of the collector region 104. Preferably, the isolating wall 134 extends more deeply than the lower face of the primary part 126 of the collector region 104.

The height (thickness) of the isolating wall 134 is, for example, between about 3 μm and about 5 μm, preferably equal to about 4 μm.

The isolating wall 134 extends along the connecting branches 130. The isolating wall 134 is preferably in contact with the connecting branches 130, preferably over the entire height of the branches 130.

The isolating wall 134 preferably surrounds the connecting branches 130. The isolating wall 134 preferably forms a ring around the connecting branches 130. The isolating wall 134 is located on the side of the connecting branches 130 of the collector region opposite the emitter region.

The lower face of the collector region 104 is, for example, located in contact with the substrate, for example in contact with a non-doped semiconductor material portion. The isolating wall 134 preferably extends in the non-doped semiconductor material portion.

The upper faces of the emitter region 106 and connecting branches of the base 108 and collector 104 regions are covered, at least partially, preferably completely, by conductive pads 136. The connecting pads 136 are thus located on the upper faces 110 of the substrate, across from the upper faces of the emitter region 106 and connecting branches 122 and 130 of the base 108 and collector 104 regions.

In a variant, at least certain connecting branches may not extend to the upper face 110 of the substrate. These branches are then separated from the connecting pads, located on the upper face 110 of the substrate, by portions, not shown, of semiconductor material, for example portions of the substrate. The portions not shown are preferably not doped. The portions not shown are not doped of the conduction type opposite the type of the corresponding branch. The portions not shown extend, for example, over a height of less than 10% of the height of the branch.

The upper face 110 of the substrate is covered by an insulating layer 138. The insulating layer 138 is at least partially passed through by conductive vias 140. The vias 140 are in contact with the connecting pads 136. Each pad 136 is in contact with a via. The insulating layer 138 in particular covers the isolating trench 118, the isolating walls 124 and 134 and the conductive pads 136, with the exception of the part of the pads 136 in contact with the vias 140.

Figure 2:
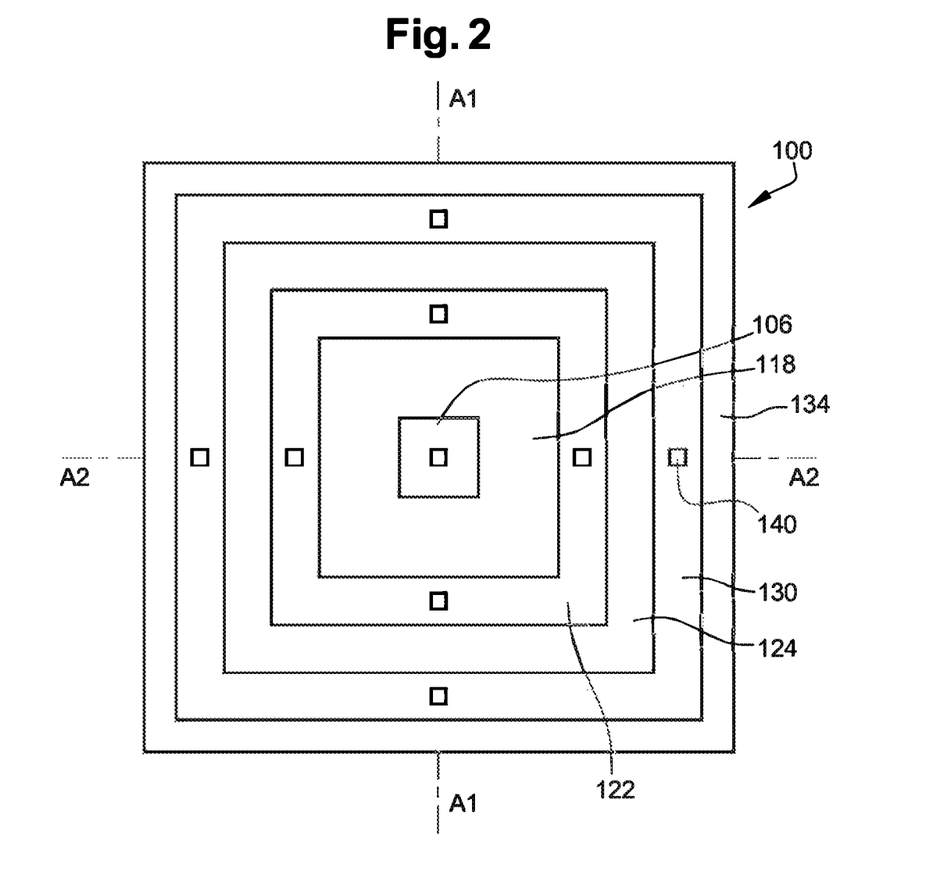
FIG. 2 is an exemplary top view of the embodiment of FIG. 1.

FIG. 2 is an exemplary top view of the embodiment of FIG. 1. FIG. 1, for example, corresponds to a view along plane A1-A1 or along plane A2-A2 of FIG. 2.

FIG. 2 comprises elements identical to the elements of FIG. 1, which will not be described in detail again. In the example of FIG. 2, the connecting pads 136 and the isolating layer 138 are not shown.

In the example of FIG. 2, the device 100 comprises five substantially concentric rings, the center being the emitter region. The isolating trench 118 is made from a ring around the emitter region 106. The branch 122 of the base region, forming a continuous wall, forms a ring around the isolating trench 118. The isolating wall 124 forms a ring around the branch 122. The branch 130 of the collector region, forming a continuous wall, forms a ring around the isolating wall 124. The isolating wall 134 forms a ring around the branch 130.

The base region is substantially U-shaped in all of the planes substantially perpendicular to the plane of the upper face of the substrate, that is to say, the plane of FIG. 2.

In the example of FIG. 2, the emitter region and the various rings are substantially square-shaped. More generally, the emitter region and the various rings can have other shapes, for example circular, rectangular, triangular, etc.

Figure 3:
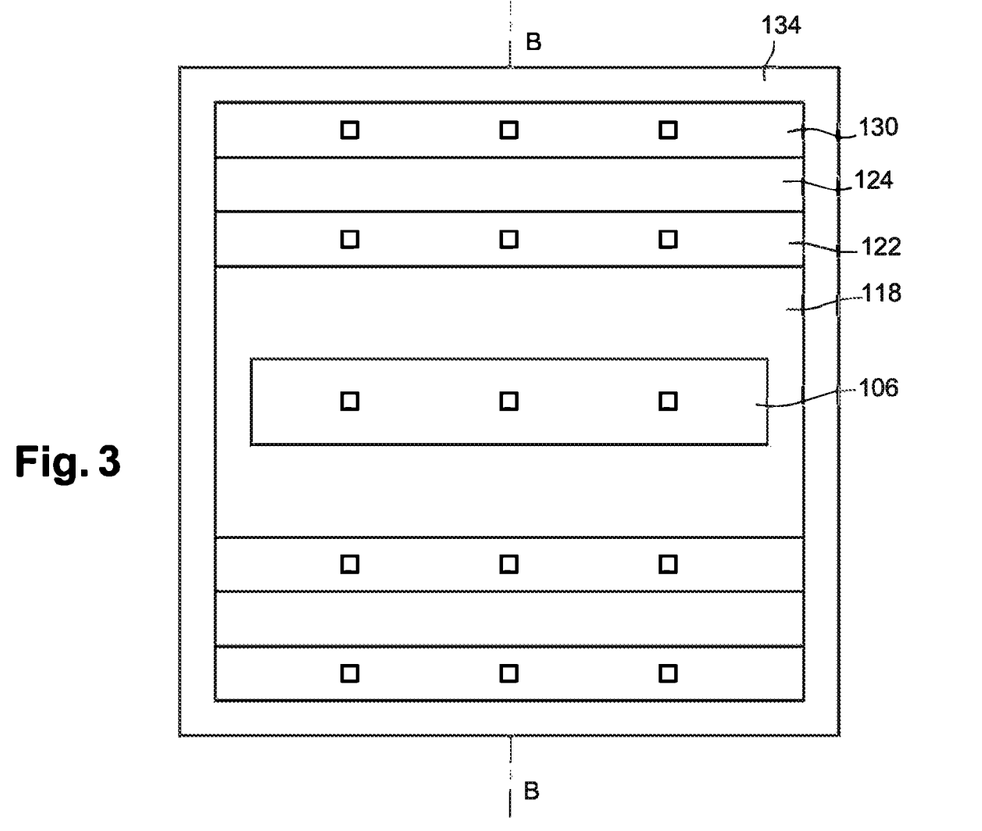
FIG. 3 is another exemplary top view of the embodiment of FIG. 1.

FIG. 3 is another exemplary top view of the embodiment of FIG. 1. FIG. 1, for example, corresponds to a view along plane B-B of FIG. 3. In the example of FIG. 3, the connecting pads 136 and the isolating layer 138 are not shown.

In the view of FIG. 3, the emitter region 106 is substantially rectangular. The emitter region is surrounded by the isolating trench 118.

In the example of FIG. 3, the device comprises two branches 122 of the base region, two isolating walls 124 and two branches 130 of the collector region.

The branches 122 are located on either side of the isolating trench 118. The branches 122 preferably extend substantially parallel to one another. Each branch 122 extends along a surface of the isolating trench 118. Each branch 122 extends in contact with a surface of the isolating trench 118. The branches 122 are mechanically and electrically connected by the primary part 120, not shown in FIG. 3. The branches 122 are not in direct contact with one another.

Each isolating wall 124 extends along a branch 122, on the side opposite the isolating trench 118. The walls 124 preferably extend substantially parallel to one another. Each wall 124 extends along a surface of one of the branches 122. Each wall 124 extends in contact with a surface of one of the branches 122. The walls 124 are not in direct contact with one another.

Each branch 130 extends along a wall 124, on the side opposite the isolating trench 118. The branches 130 preferably extend substantially parallel to one another. Each branch 130 extends along a surface of one of the walls 124. Each branch 130 extends in contact with a surface of one of the walls 124. The branches 130 are mechanically and electrically connected by the primary part 126, not shown in FIG. 3. The branches 130 are not in direct contact with one another.

The isolating wall 134, for example, surrounds the transistor continuously. The wall 134, for example, extends along the branches 130, on the side opposite the isolating trench 118. The wall 134 also extends in a direction perpendicular to the direction in which the branches 122 and 130 and the isolating walls 124 extend, along the surfaces of the branches 122 and 130 and the isolating walls 124.

FIGS. 4 to 10 show steps, preferably successive, of a method for manufacturing the embodiment of FIG. 1. The method of FIGS. 4 to 10 can apply to the example of FIG. 2 and the example of FIG. 3.

Figure 4:
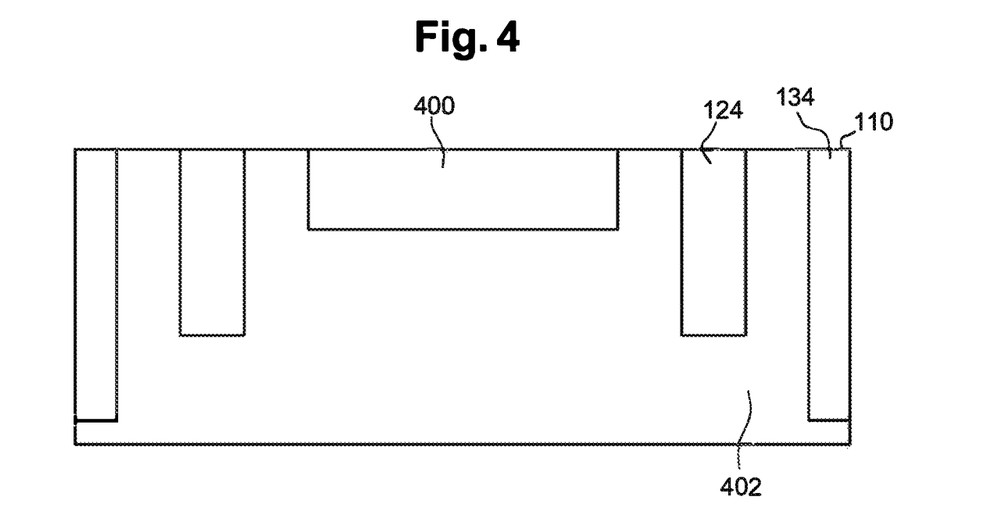
FIG. 4 shows a step of a manufacturing method of the embodiment of FIG. 1.

FIG. 4 shows a step of a manufacturing method of the embodiment of FIG. 1.

During the step shown by FIG. 4, an isolating trench 400 is formed in a substrate 402.

The substrate 402 is a non-doped (for example, intrinsic) semiconductor substrate, for example made from silicon.

The isolating trench 400 is a trench of the SSTI (Super Shallow Trench Isolation) type. The trench 400 is located in the location where the trench 118 and the emitter region 106 will subsequently be located. The trench 400 is continuous in this step of the method, that is to say, it does not comprise an opening. The trench 400 is, for example, substantially in the shape of a parallelogram.

The trench 400 extends from the upper face of the substrate 402 toward the inside of the substrate. The upper face of the isolating trench is substantially coplanar with the upper face 110 of the substrate.

The trench 400, for example, has a height (thickness) of between about 50 and about 100 nm. The width of the trench 400 is, for example, between about 150 nm and about 250 nm, preferably substantially equal to 200 nm.

During the step shown by FIG. 4, the isolating walls 124 and 134 are also formed. The dimensions of the walls 124 and 134 are as they were described in relation with FIG. 1. Likewise, the positions of the walls 124 and 134 are as they were described in relation with FIG. 1.

Figure 5:
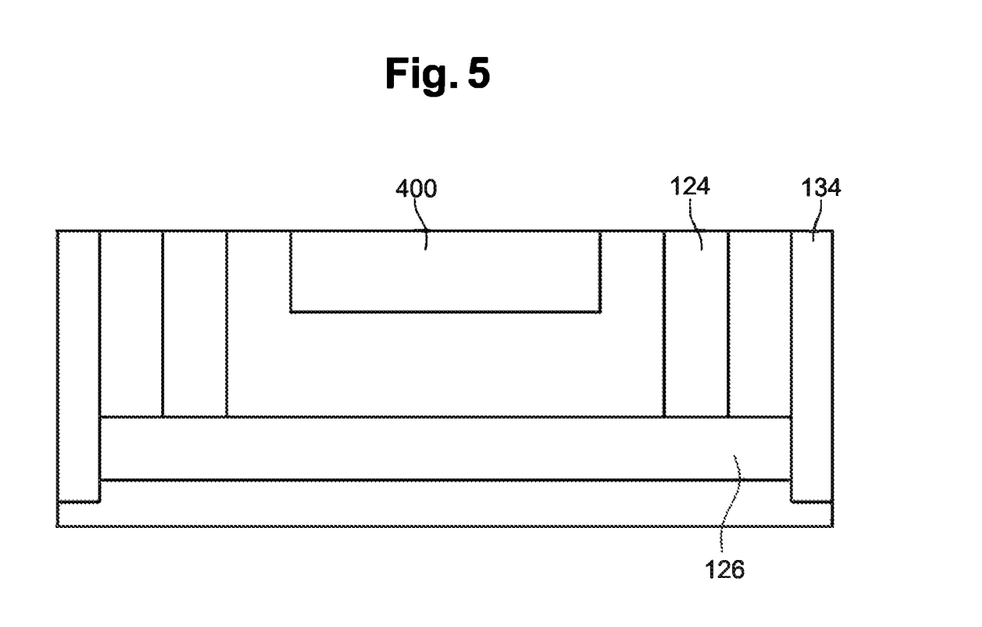
FIG. 5 shows another step of a manufacturing method of the embodiment of FIG. 1.

FIG. 5 shows another step of a manufacturing method of the embodiment of FIG. 1.

During this step, the primary part 126 of the collector region is formed. The primary part 126 is formed by dopant implantation. The implanted dopants are, for example, boron or indium. The primary part is therefore of type P.

The doping of the primary part 126 of the collector region is, for example, between about $5*10^{17}$ and about $10^{18}$ dopants/cm$^3$.

The primary part 126 is a continuous layer.

The primary part 126 preferably extends from the lower face of the isolating wall 124. The primary part 126 preferably extends over a height of less than or equal to the height difference between the isolating walls 124 and the isolating walls 134.

The primary part 126 extends below the isolating trench 400. The primary part 126 preferably extends below the isolating walls 124. The primary part 126 preferably extends until reaching the inner lateral surface of the isolating wall 134. The inner lateral surface of the insulating wall 134 is the lateral surface closest to the insulating trench 400.

One advantage of the described embodiment is that the doping of the primary part 126 can be substantially constant below the insulating trench 400.

Figure 6:
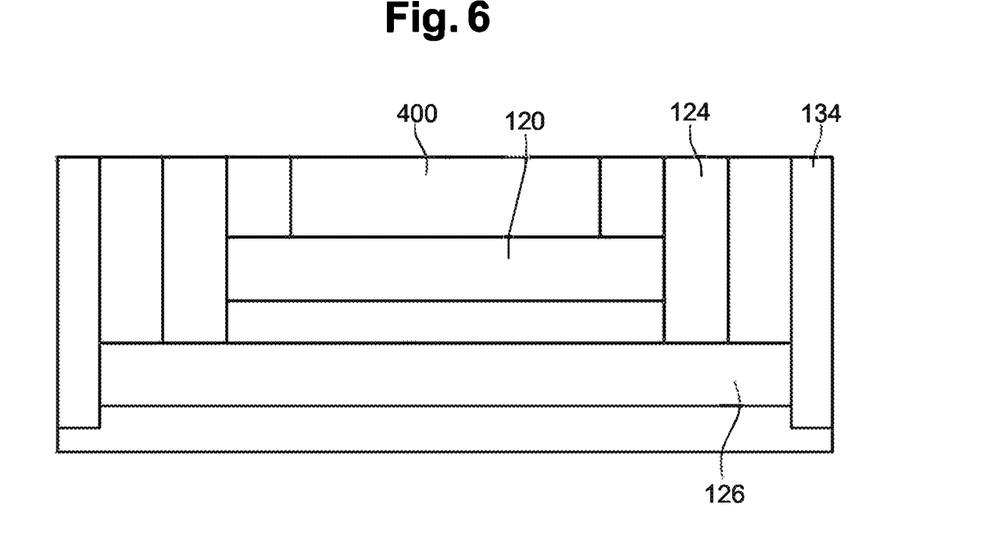
FIG. 6 shows another step of a manufacturing method of the embodiment of FIG. 1.

FIG. 6 shows another step of a manufacturing method of the embodiment of FIG. 1.

During this step, the primary part 120 of the base region is formed. The primary part 120 is formed by dopant implantation. The implanted dopants are, for example, arsenic or phosphorus. The primary part is therefore of type N.

The doping of the primary part 120 of the collector region is, for example, between about $5*10^{18}$ and about $10^{19}$ dopants/cm$^3$.

The primary part 120 is a continuous layer.

The primary part 120 preferably extends from the lower face of the trench 400. The primary part 120 extends over a height of less than the height difference between the isolating wall 124 and the isolating trench 400. The primary part 126 and the primary part 120 are separated by a distance, for example, of between about 50 and about 70 nm. The primary part 126 and the primary part 120 are separated by a height preferably greater than or equal to the height provided for the secondary part 128 (FIG. 1).

The primary part 120 extends below the isolating trench 400. The primary part 120 preferably extends until reaching the inner lateral surface of the isolating wall 124, preferably the entire ring formed by the wall 124. The inner lateral surface of the insulating wall 124 is the lateral surface closest to the insulating trench 400.

Figure 7:
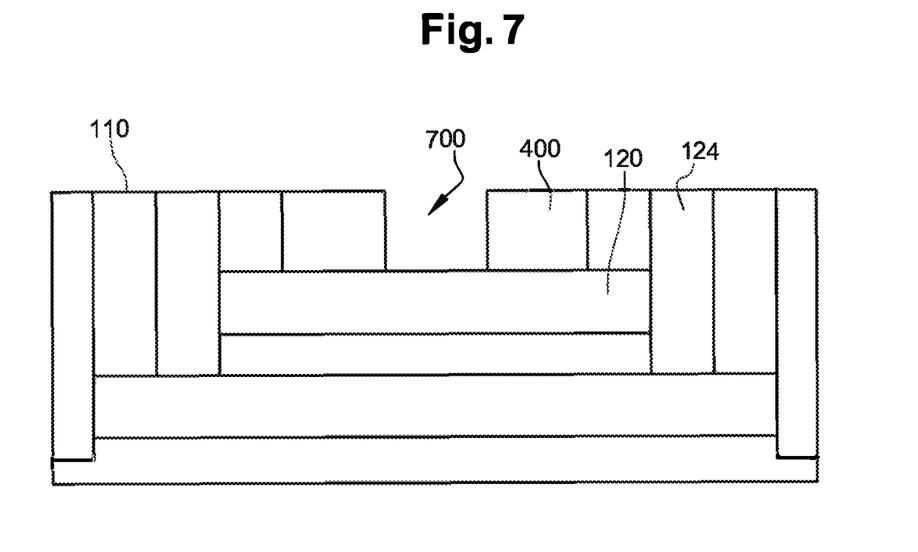
FIG. 7 shows another step of a manufacturing method of the embodiment of FIG. 1.

FIG. 7 shows another step of a manufacturing method of the embodiment of FIG. 1.

During this step, an opening 700 is formed in the isolating trench 400. The trench 400 therefore corresponds, after this step, to the trench 118 of FIG. 1. The opening 700 passes through the trench 400. The opening 700 extends from the upper face of the trench 400 to the upper face of the primary part 120.

The horizontal dimensions of the opening, that is to say, the dimensions in a plane parallel to the upper face 110 of the substrate, are equal to the desired horizontal dimensions of the emitter region.

The opening 700 is located in the trench 400. The trench 400 therefore surrounds the opening 700. Preferably, the opening is located substantially equidistant from the outer lateral surfaces of the trench 400. Outer lateral surfaces refer to the lateral surfaces closest to the isolating wall 124.

Figure 8:
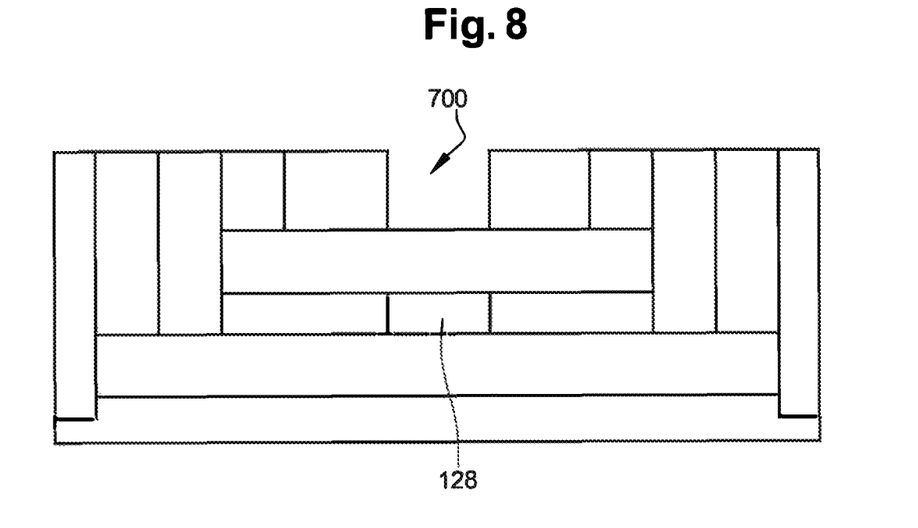
FIG. 8 shows another step of a manufacturing method of the embodiment of FIG. 1.

FIG. 8 shows another step of a manufacturing method of the embodiment of FIG. 1.

During this step, the secondary part 128 of the collector region is formed. The secondary part 128 is formed by implanting dopants through the opening 700. The isolating trench 118 therefore serves as a mask during the implantation. The horizontal dimensions of the secondary part 128 are therefore substantially equal to the horizontal dimensions of the opening 700.

The doping of the secondary part 128 of the collector region is for example between about $5*10^{17}$ and about $10^{18}$ dopants/cm$^3$.

The secondary part 128 extends from the upper face of the primary part 126 and toward the primary part 120. Preferably, the secondary part 128 extends from the upper face of the primary part 126 to the primary part 120. The secondary part 128 is thus in contact with the primary parts 120 and 126.

As a variant, the secondary part may not extend to the primary part 120. Preferably, the secondary part extends over at least half of the distance between the upper face of the primary part 126 and the lower face of the primary part 120. The upper face of the primary part 126 and lower face of the primary part 120 are the faces of the primary parts 120 and 126 that are closest to one another.

Figure 9:
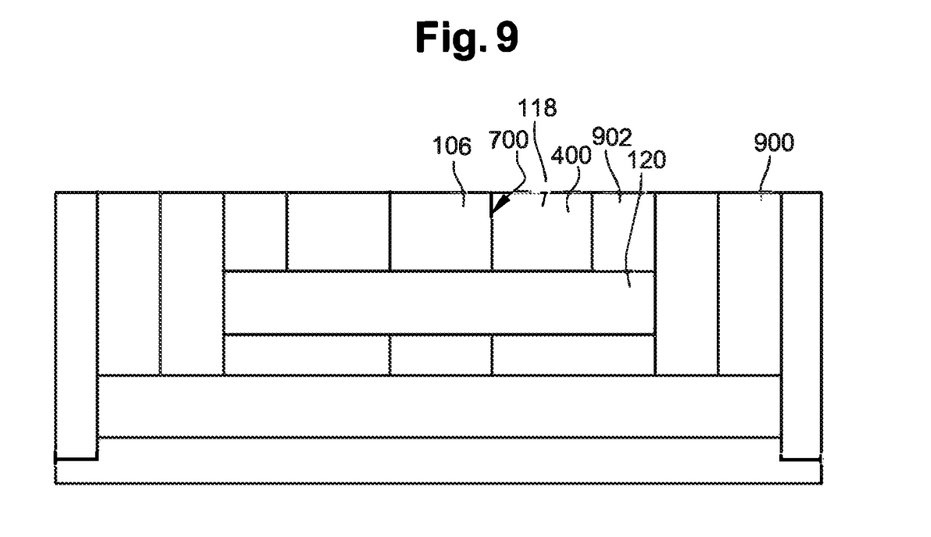
FIG. 9 shows another step of a manufacturing method of the embodiment of FIG. 1.

FIG. 9 shows another step of a manufacturing method of the embodiment of FIG. 1.

During this step, the emitter region 106 is formed in the opening 700. The region 106 is formed by epitaxy. This step therefore comprises the epitaxial growth of the material in the emitter region 106 in the opening 700. The material of the region 106 is a P-doped semiconductor material, for example doped with boron and carbon or with boron. The material of the region 106 is, for example, silicon.

The region 106 preferably extends in the entire opening 700. The region 106 preferably extends from the upper face of the primary part 120 of the base region to the upper face of the substrate. The region 106 is preferably in contact with the entire inner lateral surface of the trench 400. Inner lateral surface of the trench 400 refers to the lateral surface furthest from the wall 124.

Figure 10:
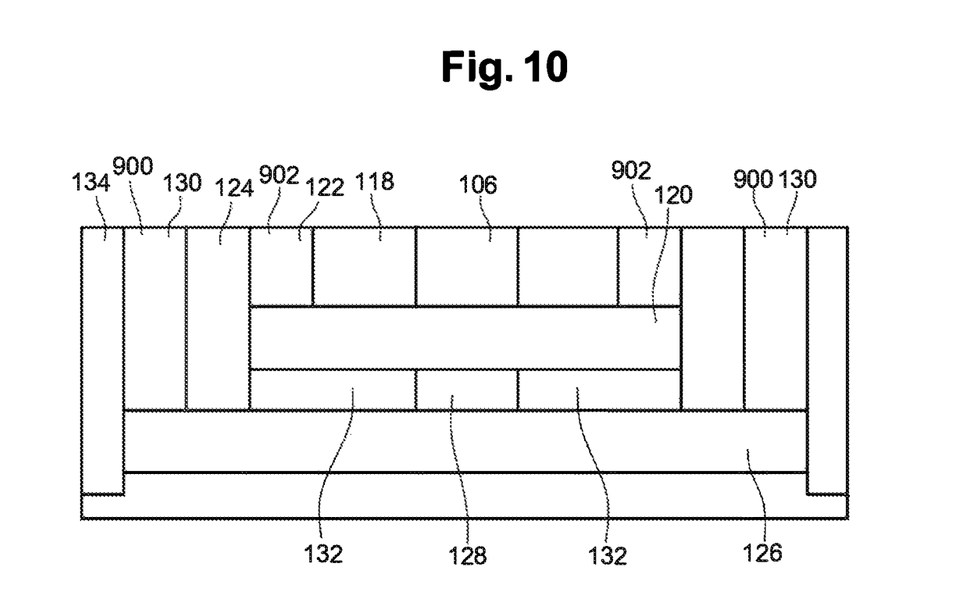
FIG. 10 shows another step of a manufacturing method of the embodiment of FIG. 1.

Different manufacturing steps for elements not shown can be carried out, for example before the step of FIG. 10. For example, steps for manufacturing other types of transistors can be carried out. These manufacturing steps optionally comprise heating and annealing steps, which can cause the diffusion of the dopants.

Thus, the dopants of the primary region 126 can diffuse in the region 132. The distance between the primary part 126 and the primary part 120 can therefore decrease. Likewise, the height of the secondary part 128 of the collector region can decrease. This case is not shown in FIG. 10.

In the case where the secondary part 128 does not extend to the primary part 120, the heating and annealing steps make it possible to diffuse the dopants from the secondary part 128 until reaching the primary part 120. The secondary part 128 is then in contact with the primary parts 120 and 126.

The dopants of the primary part 126 can then diffuse in portions 900 so as to at least partially form the branches 130 of the collector region. The portions 900 are the portions of the substrate located between the isolating walls 124 and 134. The portions 900, for example, extend between the upper face of the substrate and the upper face of the primary part 126. The dopants of the primary part 126 can, for example, be diffused in the lower part of the portions 900.

Likewise, the dopants of the primary part 120 can diffuse in portions 902 so as to at least partially form the branches 122 of the base region. The portions 902 are the portions of the substrate located between the isolating wall 124 and the isolating trench 118. The portions 902, for example, extend between the upper face of the substrate and the upper face of the primary part 120. The dopants of the primary part 120 can, for example, be diffused in the lower part of the portions 902.

FIG. 10 shows another step of a manufacturing method of the embodiment of FIG. 1.

During this step, steps for implanting dopants can be added so as to finish the formation of the branches 130 and 122. These implantation steps can, for example, correspond to implantation steps in methods for forming other components, for example other transistors. Preferably, the branches 130 and 122 extend to the upper face of the substrate. Optionally, the branches 130 and 122 do not extend to the surface of the substrate.

Steps, not illustrated, can also be carried out. In particular, the manufacturing method of the embodiment of FIG. 1 can also comprise a siliciding step. A layer of nickel-silicon (NiSi) is thus formed on the upper faces, therefore the exposed faces, of the branches 122 and 130 and the emitter region 106. Connecting pads are next formed on the nickel-silicon layers of the upper faces of the branches 122 and 130 and the emitter region 106.

The isolating layer 138 can next be formed on the upper face of the substrate. The conductive vias 140 can next be formed through the isolating layer so as to reach the pads 136.

One advantage of the described method is that a single mask (the isolating trench 118) is used for the implantation of the secondary region 128 and for the formation of the emitter region 106. The isolating trench is also used to isolate the emitter region laterally. There is therefore no need for a removal step of the mask.

Another advantage is that the described embodiments have a stray capacitance at the interface between the base region and the collector region lower than that which would have been present if the primary parts 120 and 126 were in direct contact, without the secondary part 128.

Another advantage is that the presence of the isolating trench 118 between the emitter region and the branches 122 makes it possible to limit, or even avoid, the diffusion of boron atoms from the emitter region toward the branches 122. Indeed, if the branches 122 were in contact with the emitter region, for example with the side walls of the emitter region, the boron atoms would tend, during the manufacturing method, for example during heating and annealing steps, to move in the branches 122, in particular below the pads 136 located on the branches 122. Such a phenomenon would decrease the performance of the transistor.

Various embodiments and variants have been described. Those skilled in the art will understand that certain features of these embodiments can be combined and other variants will readily occur to those skilled in the art. In particular, although the examples given in connection with FIGS. 1 to 10 comprise a PNP transistor, the embodiments also apply to NPN transistors. The types of conductivity are then reversed, P becoming N and N becoming P. The dopants of the different regions are also changed, for example exchanged with the dopants described for the opposite type of conductivity.

Likewise, although the examples given in connection with FIGS. 1 to 10 comprise a PNP transistor whose collector region is buried more deeply than the emitter region, the emitter and collector regions can be reversed.

Finally, the practical implementation of the embodiments and variants described herein is within the capabilities of those skilled in the art based on the functional description provided hereinabove.

The invention claimed is:

1. A transistor device of a bipolar type, comprising:
   a semiconductor substrate;
   an isolating trench in the semiconductor substrate;
   an opening extending through the isolating trench;
   a first part of a first region of the transistor located in the semiconductor substrate at a level below the isolating trench, said first part being doped with a first conductivity type and aligned with said opening;
   a second region of the transistor doped with the first conductivity type and located within the opening; and
   a third region of the transistor doped with a second conductivity type and located between the first part and the second region;
   wherein the first part of the first region and the second region have substantially equal horizontal dimensions.

2. The transistor device according to claim 1, wherein lateral surfaces of the second region are in contact with the isolating trench in the semiconductor substrate at said opening.

3. The transistor device according to claim 2, further comprising:
   an isolating wall in the semiconductor substrate; and
   a second part of the first region located in the semiconductor substrate and which extends under said isolating wall.

4. The transistor device according to claim 3, wherein said isolating wall has a depth in the semiconductor substrate that is deeper than a depth of the isolating trench.

5. The transistor device according to claim 3, further comprising a deep trench isolation in the semiconductor substrate, said deep trench isolation being separated from the isolating wall by portions of the semiconductor substrate, said deep trench isolation surrounding the isolating trench and the isolating wall.

6. The transistor device according to claim 5, wherein the deep trench isolation has a depth in the semiconductor substrate that is greater than a depth in the semiconductor substrate of the isolating wall.

7. The transistor device according to claim 5, wherein lateral surfaces of the second part of the first region are in contact with the deep trench isolation.

8. The transistor device according to claim 2, wherein the third region extends between the first part of the first region and the second region and below the isolating trench.

9. The transistor device according to claim 8, further comprising a second part of the first region which extends across from the third region, with the first part of the first region being located between the second part of the first region and the third region.

10. The transistor device according to claim 9, wherein the second part of the first region is partially separated from the third region by non-doped portions of the semiconductor substrate.

11. The transistor device according to claim 8, wherein the first, second and third regions are buried regions.

12. The transistor device according to claim 1, wherein the transistor of the bipolar type is a PNP transistor.

13. The transistor device according to claim 1, wherein the first region is a collector region, the second region is an emitter region and the third region is a base region.

14. The transistor device according to claim 13, wherein a height of the first part of the first region is greater than 50 nm, a height of the second region is between about 50 and about 100 nm, and a height of the third region is between about 100 and about 250 nm.

15. The transistor device according to claim 1, wherein the second region is doped with boron.

16. The transistor device according to claim 1, wherein the upper face of the transistor is substantially planar.

17. A bipolar transistor, comprising:
a semiconductor substrate;
an isolating trench in the semiconductor substrate that is filled with isolating material;
a first collector part of the bipolar transistor formed by a doped region of a first conductivity type in the semiconductor substrate below the isolating trench;
a base part of the bipolar transistor formed by a doped region of a second conductivity type in the semiconductor substrate between the isolating trench and the first collector part;
an opening in the isolating trench;
a second collector part of the bipolar transistor aligned with said opening and formed by a doped region of the first conductivity type in the semiconductor substrate between the base part and the first collector part; and
an emitter part of the bipolar transistor in the opening formed by epitaxial semiconductor material doped with the first conductivity type;
wherein the second collector part and the emitter part in the opening have substantially equal horizontal dimensions.

18. The bipolar transistor of claim 17, further comprising first isolation walls in the semiconductor substrate that are separated from the isolating trench.

19. The bipolar transistor of claim 18, wherein said first collector part of the bipolar transistor extends below a bottom of the first isolation walls.

20. The bipolar transistor of claim 18, further comprising second isolation walls in the semiconductor substrate that are separated from the first isolation walls.

21. The bipolar transistor of claim 20, wherein said first collector part of the bipolar transistor extends between sides of the second isolation walls.

22. The bipolar transistor of claim 21, wherein the first isolation walls have a first depth in the semiconductor substrate, wherein the second isolation walls have a second depth in the semiconductor substrate, and wherein the second depth is greater than the first depth.

23. The bipolar transistor of claim 17, wherein a portion of the semiconductor substrate is positioned between first collector part and the base part.

24. The bipolar transistor of claim 23, wherein the second collector part extends through said portion of the semiconductor substrate.

* * * * *